United States Patent
Hopper

Patent Number: 5,981,346
Date of Patent: Nov. 9, 1999

[54] PROCESS FOR FORMING PHYSICAL GATE LENGTH DEPENDENT IMPLANTED REGIONS USING DUAL POLYSILICON SPACERS

[75] Inventor: Peter J. Hopper, San Jose, Calif.

[73] Assignee: National Semiconductor Corporation, Santa Clara, Calif.

[21] Appl. No.: 09/271,062

[22] Filed: Mar. 17, 1999

[51] Int. Cl.$^6$ ................................. H01L 21/336
[52] U.S. Cl. ................. 438/304; 438/301; 438/305
[58] Field of Search ........................... 438/275, 276, 438/301, 304, 305

[56] References Cited

U.S. PATENT DOCUMENTS

| | | | |
|---|---|---|---|
| 4,536,944 | 8/1985 | Bracco et al. | 29/571 |
| 4,975,385 | 12/1990 | Beinglass et al. | 437/44 |
| 5,063,172 | 11/1991 | Manley | 437/43 |
| 5,066,606 | 11/1991 | Lee | 437/52 |
| 5,212,106 | 5/1993 | Erb et al. | 437/45 |
| 5,215,937 | 6/1993 | Erb et al. | 437/45 |
| 5,238,859 | 8/1993 | Kamijo et al. | 437/44 |
| 5,376,578 | 12/1994 | Hsu et al. | 437/56 |
| 5,496,750 | 3/1996 | Moslehi | 437/41 |
| 5,514,609 | 5/1996 | Chen et al. | 437/45 |
| 5,583,061 | 12/1996 | Williams et al. | 437/44 |
| 5,618,743 | 4/1997 | Williams et al. | 438/276 |
| 5,770,506 | 6/1998 | Koh | 438/303 |

OTHER PUBLICATIONS

Silicon Processing for the VLSI Era, vol. I: Process Technology, pp. 185, 280–283, 522, Lattice Press (1986).
Silicon Processing for the VLSI Era, vol. II: Process Integration, p. 325, Lattice Press (1990).
Silicon Processing for the VLSI Era, vol. III: The Submicron Mosfet, pp. 183–187, 226, 232–240, Lattice Press (1995).

*Primary Examiner*—John F. Niebling
*Assistant Examiner*—Walter L. Lindsay, Jr.
*Attorney, Agent, or Firm*—Limbach & Limbach L.L.P.

[57] ABSTRACT

Process for forming physical gate length dependent implanted regions in a semiconductor substrate. The process includes steps of first providing a semiconductor substrate (e.g. a silicon wafer) with a gate oxide layer on its surface, followed by the formation of a polysilicon gate layer on the gate oxide layer. An additional oxide layer is subsequently formed on the polysilicon gate layer. The resulting oxide/polysilicon stack is then patterned to form a patterned oxide/polysilicon stack layer that includes a patterned additional oxide layer and a patterned polysilicon gate layer. Next, a conformal silicon nitride layer is formed over the patterned oxide/polysilicon stack layer. The conformal silicon nitride layer is then etched (e.g. by an anisotropic etch) to form silicon nitride spacers on the sidewalls of the patterned oxide/polysilicon stack layer. After removal of the patterned additional oxide layer to leave the silicon nitride spacers extending above the patterned polysilicon gate layer, an additional polysilicon layer is deposited. The additional polysilicon layer is then etched (e.g. by an anisotropic plasma etch) to create dual (i.e. internal and external) polysilicon spacers on the sidewalls of the silicon nitride spacers. Next, dopant atoms (e.g. dopant atoms chosen to serve as a physical gate length dependent $V_T$ adjust implant) are implanted, through the patterned polysilicon gate layer, into the semiconductor substrate to create an implanted region while using the dual polysilicon spacers (the pitch and profile of their internal portions being dependent on the physical gate length) as an implant mask.

11 Claims, 6 Drawing Sheets

PROCESS FOR FORMING PHYSICAL GATE LENGTH DEPENDENT IMPLANTED REGIONS USING DUAL POLYSILICON SPACERS

BACKGROUND OF THE INVENTION

1. Field of the Invention

The present invention relates to semiconductor device fabrication processes and, in particular, to processes for the formation of dopant atom implanted regions.

2. Description of the Related Art

The fabrication of semiconductor devices often involves the processing of a semiconductor substrate (e.g. a silicon wafer) through a series of steps. Typically, this series of steps includes multiple ion implantation processes during which dopant atoms are introduced into and beyond the semiconductor substrate. The dopant atoms are added to the semiconductor substrate to form various semiconductor device regions, such as well regions, source and drain regions, and Lightly Doped Drain (LDD) extension regions. The dopant atoms are also added to modify the electrical characteristics of the semiconductor device, as in the case of Threshold Voltage ($V_T$) adjust implants. See S. Wolf and R. N. Tauber, *Silicon Processing for the VLSI Era, Volume 1—Process Technology*, 280–283 (Lattice Press 1986), which is hereby incorporated by reference, for a further discussion of ion implantation processes.

$V_T$ adjust implant processes involve implanting dopant atoms into a channel region of an MOS transistor device to increase or decrease the net dopant atom concentration therein. It is well known in the semiconductor device fabrication field that $V_T$ adjust implants can be used to control the threshold voltage of the semiconductor device. See S. Wolf, *Silicon Processing for the VLSI Era, Volume 2—Process Integration*, 325 (Lattice Press 1990), and S. Wolf, *Silicon Processing for the VLSI Era, Volume 3—The Submicron MOSFET*, 183–187 (Lattice Press 1995), both of which are hereby incorporated by reference. As the length of a channel region (i.e. "channel length") of an MOS transistor device is reduced, however, the MOS transistor device becomes more susceptible to unwanted "punch-through" that results from a merging of source and drain depletion regions. Further, as the channel length is decreased, the MOS transistor device can experience two competing threshold voltage ($V_T$) effects: one known as "$V_T$ roll-up" or "reverse short channel effect (RSCE)," and the other known as "$V_T$ roll-off." $V_T$ roll-up causes the $V_T$ of the MOS transistor device to increase with decreasing channel length, while $V_T$ roll-off causes the $V_T$ to decrease after reaching its maximum RSCE induced value. For a further discussion of punch-through and the RSCE, see S. Wolf, *Silicon Processing for the VLSI Era, Volume 3—The Submicron MOSFET*, 226 and 232–240 (Lattice Press 1995), which is hereby incorporated by reference. The result of these effects is that as the physical gate length (i.e. the width of the patterned polysilicon gate layer), and hence the channel length, of an MOS transistor device decreases, the electrical behavior of the MOS transistor device becomes more difficult to control. Conventional $V_T$ adjust implant processes can not address these $V_T$ roll-up and $V_T$ roll-off effects since they are conducted prior to the formation of the patterned polysilicon gate layer and are, therefore, independent of physical gate length.

There is, therefore, a need in the field for an implant process that forms physical gate length dependent dopant implanted regions and thereby provides for improved control of MOS transistor device performance (e.g. $V_T$ control).

SUMMARY OF THE INVENTION

The present invention provides a process for forming physical gate length dependent implanted regions in a semiconductor substrate. The implanted regions created by processes in accordance with the present invention are considered to be "physical gate length dependent" since their location, dimensions and dopant atom concentration are a function of the width of a patterned polysilicon gate layer (i.e. the physical gate length) overlying the implanted region. Therefore, when a patterned polysilicon gate layer includes more than one physical gate length, the implanted region corresponding to each of these physical gate lengths will differ from one another in terms of their location, dimension and/or dopant atom concentration.

Processes in accordance with the present invention include steps of first providing a semiconductor substrate (e.g. a silicon wafer) with a gate oxide layer on its surface, followed by the formation of a polysilicon gate layer (e.g. 100 angstroms to 500 angstroms in thickness) on the gate oxide layer. An additional oxide layer is subsequently formed on the polysilicon gate layer. The combination of an additional oxide layer and an underlying polysilicon gate layer constitutes an oxide/polysilicon stack. The oxide/polysilicon stack is then patterned to form a patterned oxide/polysilicon stack layer that includes both a patterned additional oxide layer and a patterned polysilicon gate layer. The patterning of the oxide/polysilicon stack also exposes portions of the gate oxide layer. The patterned polysilicon gate layer can include more than one physical gate length. Next, a conformal silicon nitride layer is deposited over the patterned oxide/polysilicon stack layer and the exposed portions of the gate oxide layer. This conformal silicon nitride layer is then etched (e.g. by an anisotropic etch) to form silicon nitride spacers on the sidewalls of the patterned oxide/polysilicon stack layer. Next, the patterned additional oxide layer is removed to expose the patterned polysilicon gate layer and to leave the silicon nitride spacers extending above the patterned polysilicon gate layer. An additional polysilicon layer is then formed covering the silicon nitride spacers and the exposed patterned polysilicon gate layer. The additional polysilicon layer is then etched (e.g. by an anisotropic plasma etch) to create dual polysilicon spacers on the sidewalls of the silicon nitride spacers. Next, dopant atoms (e.g. dopant atoms chosen to serve as a physical gate length dependent $V_T$ adjust implant) are implanted, through the patterned polysilicon gate layer, into optimum predetermined regions of the semiconductor substrate to create a physical gate length dependent implanted region. The implanted region is dependent on the physical gate length since the dual polysilicon spacers are used as implant masks during this $V_T$ adjust implant process step. The spacing (i.e. pitch) and profile of these dual polysilicon spacers are dependent on the physical gate length of their corresponding patterned polysilicon gate layer.

Processes according to the present invention can be used to create physical gate length dependent implanted regions, such as $V_T$ adjust implant regions, that are confined to the center of a channel region or completely blocked from entering the channel region by the dual polysilicon spacers. The processes in accordance to the present invention, therefore, provides the ability to control the level of $V_T$ roll-up and $V_T$ roll-off in MOS transistor devices.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

In order to provide a clear and consistent understanding of the present invention and claims, the following definitions are hereby provided:

The terms "dopant" and "dopants" refer to donor and acceptor impurity atoms, such as N-type phosphorous (P), N-type arsenic (As), P-type boron (B) and P-type indium (In), which are intentionally introduced into a semiconductor substrate (e.g. a silicon wafer) in order to change the charge-carrier concentration of the semiconductor substrate. See, R. S. Muller and T. I. Kamins, *Device Electronics for Integrated Circuits* 2$^{nd}$ *Edition*, 11–14 (John Wiley and Sons 1986) for a further description of dopants.

The term "oxide layer" refers to single-layered silicon dioxide ($SiO_2$), as well as to multi-layered silicon dioxide (i.e. oxide "stacks"), both regardless of the presence of dopants or other additives. The term, therefore, includes: (i) silicon dioxide layers formed by the decomposition of tetraethyl-orthosilicate (TEOS, $Si[OC_2H_5]_4$); (ii) silicon dioxide layers resulting from the reaction of silane ($SiH_4$) or dichlorosilane ($SiCl_2H_2$); (iii) phosphosilicate glass (PSG) layers; and (iv) other $SiO_2$ based layers known in the field.

The term "conformal," when used in reference to a layer, means that the layer is formed on a substrate in such a manner that the thickness of the layer is essentially identical over any substrate surface topography. Therefore, when a conformal layer is formed over a patterned layer, the thickness of the conformal layer is identical on both the vertical and horizontal surfaces of the underlying patterned layer. See S. Wolf and R. N. Tauber, *Silicon Processing for the VLSI Era, Volume 1—Process Technology*, 185 (Lattice Press 1986), which is hereby incorporated by reference, for a further discussion of the term "conformal".

The terms "anisotropic" and "anisotropically" refer to an etch and etching technique wherein the etch proceeds primarily in one direction, typically in a vertical direction. See S. Wolf and R. N. Tauber, *Silicon Processing for the VLSI Era, Volume 1—Process Technology*, 522 (Lattice Press 1986), which is hereby incorporated by reference, for a further discussion of the term "anisotropic".

Figure 1:
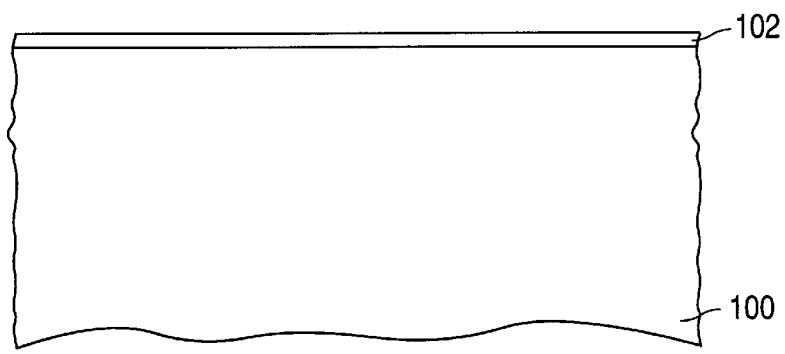
FIGS. 1–17 are cross-sectional views illustrating stages in a process in accordance with the present invention.
Figure 2:
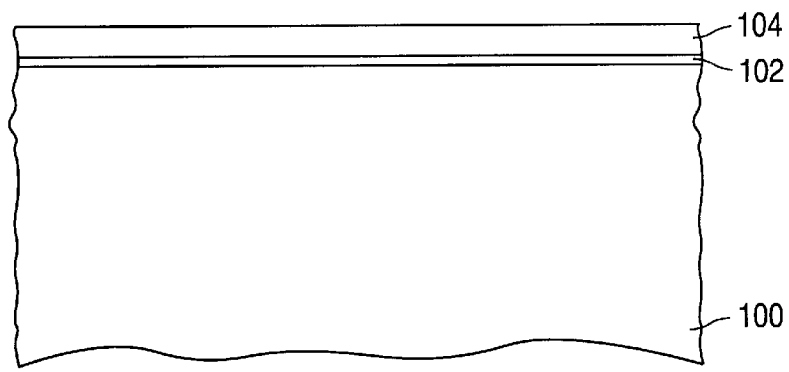

FIGS. 1–17 illustrate stages in a process in accordance with the present invention wherein the implanted region formed thereby is a physical gate length dependent $V_T$ adjust implanted region. It will be understood by one of ordinary skill in the field, however, that a process according to the present invention can be also utilized for the formation of various other physical gate length dependent implanted regions. First, a semiconductor substrate 100 (e.g. a silicon wafer) with a gate oxide layer 102 on its surface is provided, as illustrated in FIG. 1. Gate oxide layer 102 is typically a thermally grown $SiO_2$ layer of less than 100 angstroms in thickness. A polysilicon gate layer 104 is then deposited on the gate oxide layer 102 using standard techniques well known in the field, such as Low Pressure Chemical Vapor Deposition (LPCVD). The polysilicon gate layer 104 has a typical thickness in the range of 100 to 500 angstroms. The resulting structure is shown in FIG. 2.

Figure 3:
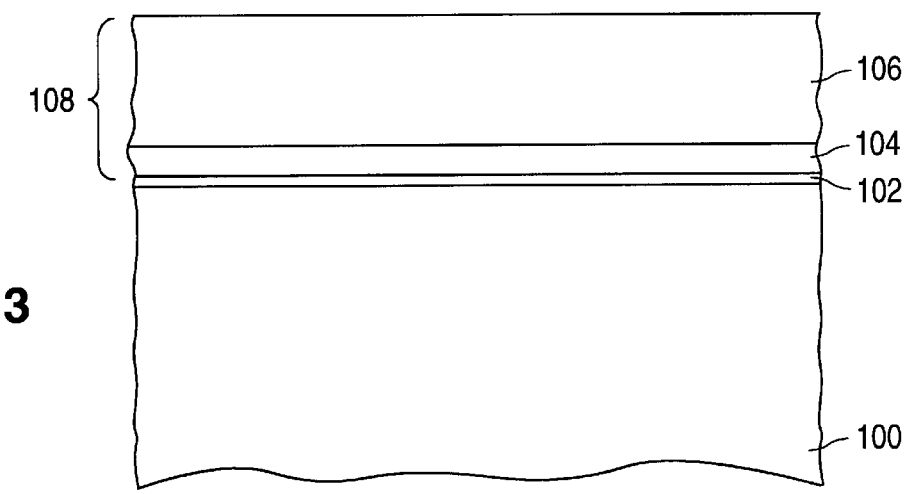

Next, an additional oxide layer 106 is deposited on the polysilicon gate layer 104, as illustrated in FIG. 3, by conventional means that are known to those of skill in the field, such as LPCVD or plasma-enhanced Chemical Vapor Deposition (PECVD). The combination of the additional oxide layer 106 and the immediately underlying polysilicon gate layer 104 is referred to as an oxide/polysilicon stack 108. The additional oxide layer 106 has a typical thickness in the range of 1000 angstroms to 3000 angstroms. Although TEOS-based oxides, silane-based oxides, PSG and other silicon dioxides ($SiO_2$) known in the field can be employed as the additional oxide layer 106, PSG is preferred due to its high etch selectivity versus both polysilicon and undoped thermally grown $SiO_2$.

Figure 4:
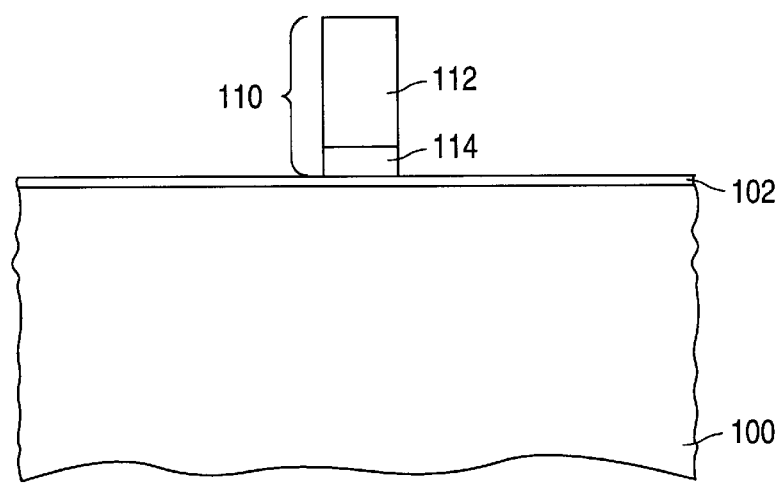
Figure 5:
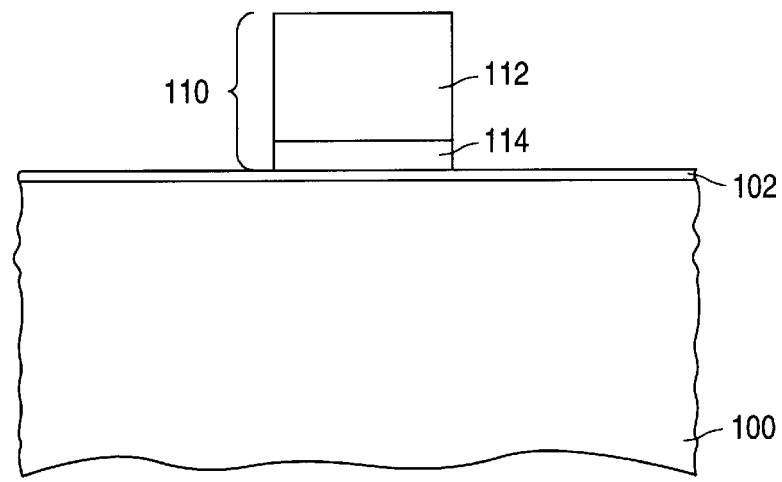

Next, the oxide/polysilicon stack 108 is patterned to form a patterned oxide/polysilicon stack layer 110, exposing portions of the gate oxide layer 102. The resultant structure is illustrated in FIG. 4 for a device having a short physical gate length (e.g. a 0.08 micron device), as well as in FIG. 5 for a device having a long physical gate length (e.g. a 0.20 micron device). The patterned oxide/polysilicon stack layer 110 includes a patterned additional oxide layer 112 and a patterned polysilicon gate layer 114. This patterning step can be accomplished by, for example, an anisotropic oxide etch and an anisotropic polysilicon etch that stops on the gate oxide layer 102, using a patterned photoresist layer as an etch mask.

Figure 6:
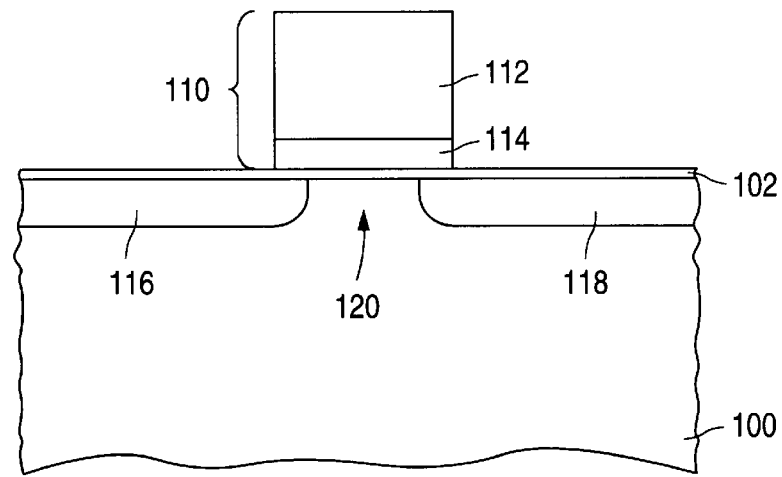

Next, LDD source extension region 116 and LDD drain extension region 118 are optionally formed in the conventional manner via ion implantation of LDD dopant atoms. Typical NMOS transistor LDD implant parameters include phosphorous (P) or arsenic (As) as the LDD dopant atoms, an implant energy of from 5 KeV to 50 KeV, an implant angle of from 0 degrees to 70 degrees, and an implant dose in the range of 1E13 ions/$cm^2$ to 1E15 ions/$cm^2$. Typical PMOS transistor LDD implant parameters are identical to those for an NMOS transistor, except for the LDD dopant atoms being either boron (B), $BF_2$, or indium (In). In an MOS transistor, the semiconductor substrate region between the LDD source extension region 116 and the LDD drain extension region 118 is known as the channel region 120. The resultant structure is illustrated in FIG. 6 for a device having a long (e.g. 0.20 micron) physical gate length.

Figure 7:
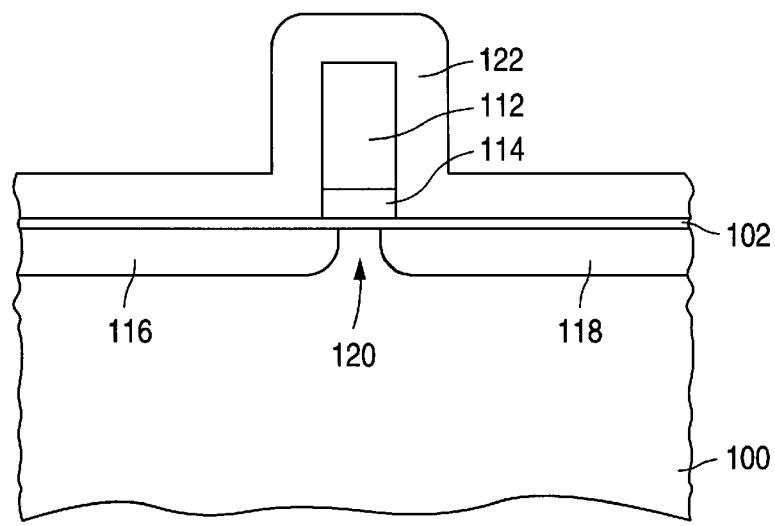
Figure 8:
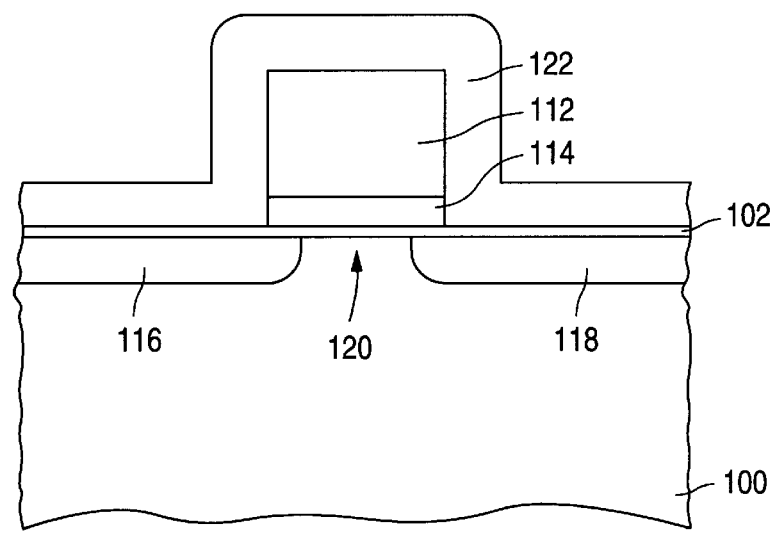
Figure 9:
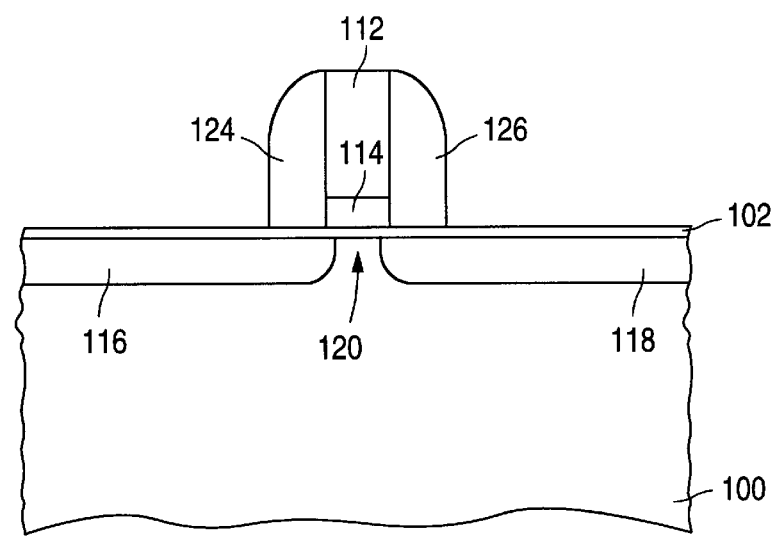
Figure 10:
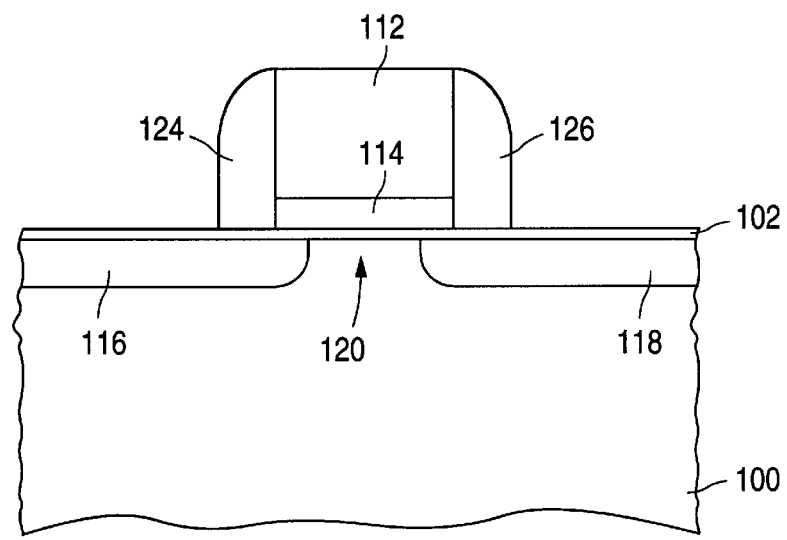

Next, a conformal silicon nitride layer ($Si_3N_4$) 122 is formed covering the patterned oxide/polysilicon stack layer 110 and the exposed portions of the gate oxide layer 102, as illustrated in FIG. 7 for a device having a short (e.g. 0.08 micron) physical gate length and in FIG. 8 for a device having a long (e.g. 0.20 micron) physical gate length. A typical conformal silicon nitride layer has a thickness in the range of 400 angstroms to 1500 angstroms (0.04 microns to 0.15 microns). Conformal silicon nitride layers can be deposited using either LPCVD or PECVD techniques. The conformal silicon nitride layer 122 is subsequently anisotropically etched to form silicon nitride spacers 124 and 126 on the sidewalls of the patterned oxide/polysilicon stack layer 110. Due to the anisotropic nature of the etch (i.e. a primarily vertical etch), the width of the silicon nitride spacers is essentially the same as the thickness of the conformal silicon nitride layer 122. The resultant structure is illustrated in FIG. 9 for a device having a short (e.g. 0.08 micron) physical gate length and in FIG. 10 for a device having a long (e.g. 0.20 micron) physical gate length.

Next, a source region 128 and a drain region 130 are optionally formed in the semiconductor substrate 100 in the conventional manner via ion implantation. Typical source and drain region ion implantation parameters include an implant energy in the range of 20 KeV to 100 KeV, an implant angle of 0 degrees and an implant dose in the range of 1E15 ions/cm² to 1E16 ions/cm². During the formation of source and drain regions via ion implantation, the silicon nitride spacers 124 and 126 serve as implant masks to define the boundaries of the source and drain regions. In conventional semiconductor device fabrication processes, the minimum width of these silicon nitride spacers is determined by the separation distance needed to avoid silicide bridging between metal silicide layers on a source/drain region and a metal silicide layer on the polysilicon gate layer. In processes according to the present invention, however, dual polysilicon spacers that will be formed on the sidewalls of the silicon nitride spacers serve to increase the effective total width of the spacers. The minimum width of the silicon nitride spacers, therefore, can be made thinner than the minimum width possible in conventional processes. The ability to use a thinner silicon nitride spacer in processes according to the present invention provides for shorter LDD source and drain extension regions, thereby reducing their parasitic resistance.

Figure 11:
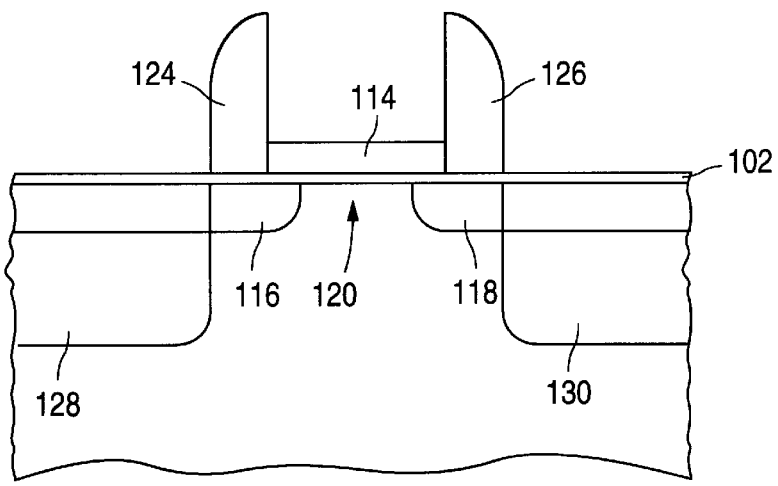
Figure 12:
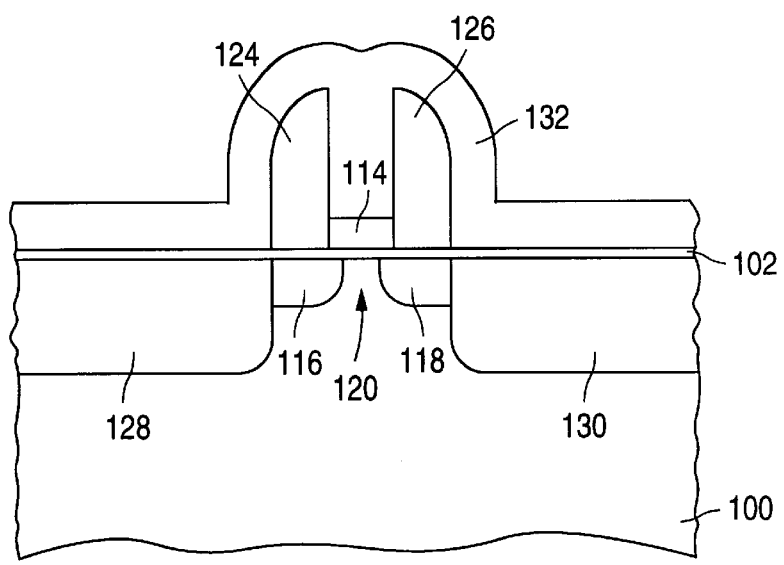
Figure 13:
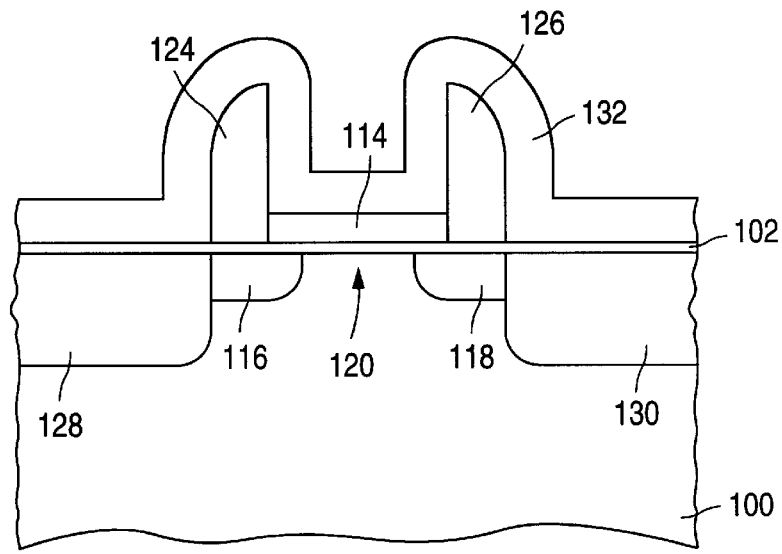

Next, the patterned additional oxide layer 112 is removed, for example, by a selective plasma etch technique, exposing the patterned polysilicon gate layer 114 and leaving the silicon nitride spacers 124 and 126 extending above the patterned polysilicon gate layer 114. The silicon nitride spacers 124 and 126 extend above the patterned polysilicon gate layer 114 by an amount approximately equal to the thickness of the patterned additional oxide layer 112. The resultant structure is illustrated in FIG. 11 for a device having a long (e.g. 0.20 micron) physical gate length. An additional polysilicon layer 132 is then deposited over the silicon nitride spacers 124 and 126, patterned polysilicon gate layer 114 and the exposed portions of the gate oxide layer 102. The additional polysilicon layer 132 has a typical thickness in the range of 200 angstroms to 1500 angstroms. The resultant structure is illustrated in FIG. 12 for a device having a short (e.g. 0.08 micron) physical gate length and in FIG. 13 for a device having a long (0.20 micron) physical gate length.

Figure 14:
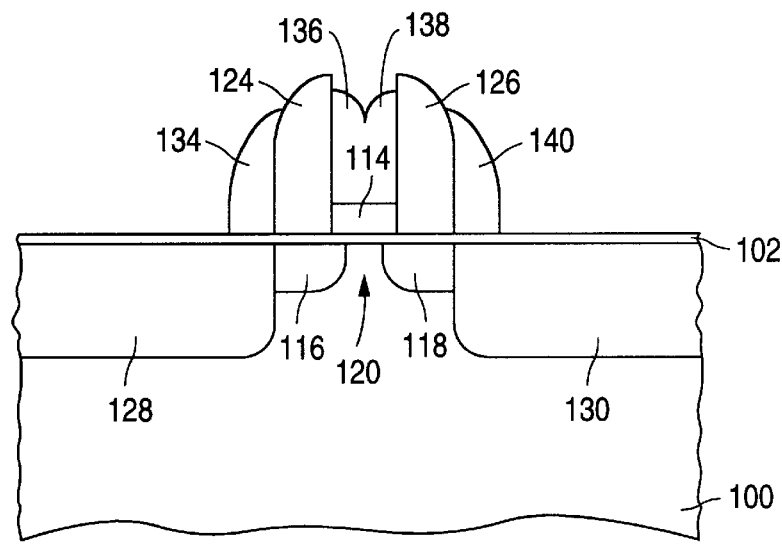
Figure 15:
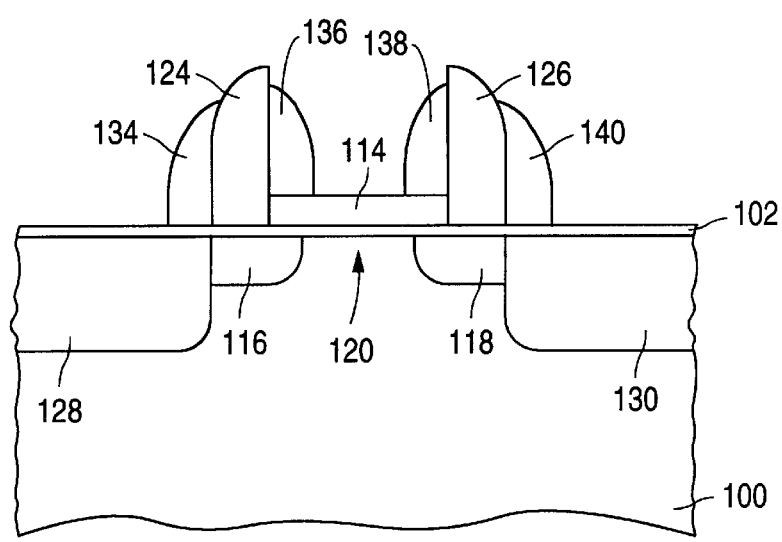

Next, the additional polysilicon layer 132 is anisotropically etched to create dual polysilicon spacers 134 (i.e. an external portion) and 136 (i.e. an internal portion) on the sidewalls of silicon nitride spacer 124, as well as dual polysilicon spacers 138 (i.e. an internal portion) and 140 (i.e. an external portion) on the sidewalls of silicon nitride spacer 126. In other words, dual polysilicon spacers are created on the sidewalls of each of the silicon nitride spacers 124 and 126. The resultant structure is illustrated in FIG. 14 for a device having a short (e.g. 0.08 micron) physical gate length and in FIG. 15 for a device having a long (e.g. 0.20 micron) physical gate length. As is apparent from FIGS. 14 and 15, the profile of the internal portions of dual polysilicon spacers 136 and 138 is a function of the physical gate length. For a device having a short physical gate length (see FIG. 14), the internal portions of the dual polysilicon spacers 136 and 138 are partially overlapped (i.e. "merged") with each other, thereby "pinching-off" any spacing therebetween. For the device having a long physical gate length (see FIG. 15), on the other hand, the internal portions of the dual polysilicon spacers 136 and 138 are completely separated across the patterned polysilicon gate layer 114.

Figure 16:
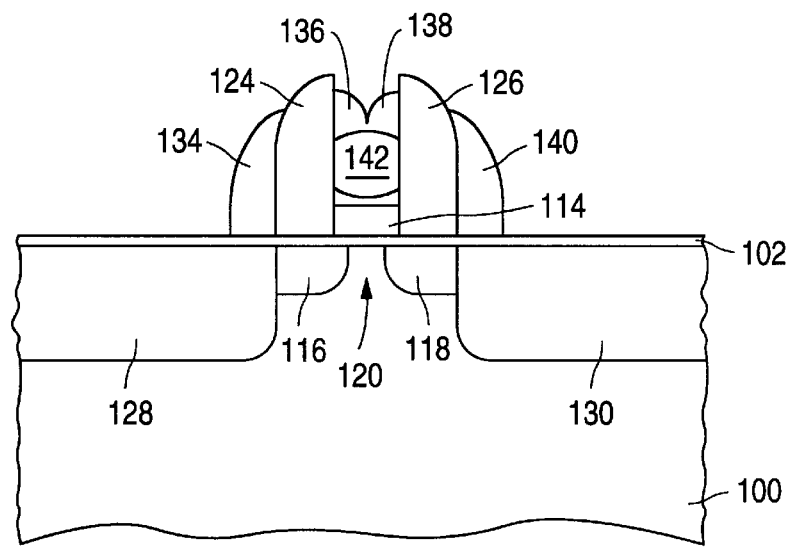
Figure 17:
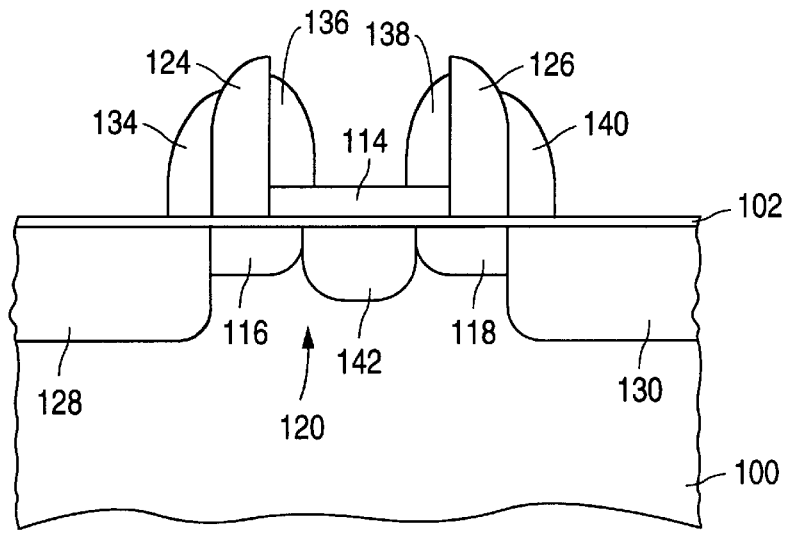

Next, dopant atoms are implanted to create a physical gate length dependent implanted region 142, such as $V_T$ adjust implanted region, while using the silicon nitride spacers 124 and 126 and the dual polysilicon spacers 134, 136, 138 and 140 as implant masks. The resultant structure is illustrated in FIG. 16 for a device having a short physical gate length and in FIG. 17 for a device having a long physical gate length.

Typical physical gate length dependent $V_T$ adjust implant process step would be conducted at an implant angle of 0 degrees, an implant dose in the range of 1E12 ions/cm² to 7E13 ions/cm² and an implant energy in the range of 10 KeV to 80 KeV.

The location, dimensions and dopant atom concentration of the physical gate length dependent implanted region 142 are a function of the physical gate length. For the device with a long physical gate length (see FIG. 17), a relatively large physical gate length dependent implanted region 142 is formed in the center of the channel region 120. This is because complete separation of the internal portions of the dual polysilicon spacers 136 and 138 across the patterned polysilicon gate layer 114 permitted dopant atoms to penetrate the patterned polysilicon gate layer 114 and enter the channel region 120 at that location. On the other hand, for the device with a short physical gate length (see FIG. 16), the physical gate length dependent implanted region 142 is formed in the partially overlapped internal portions of the dual polysilicon spacers 136 and 138. This is because the partially overlapped internal portions of the dual polysilicon spacers 136 and 138 blocked dopant atoms from penetrating therethrough and into the channel region 120. In other words, due to the overlapping (i.e. "merging") of the internal portions of the dual polysilicon spacers 136 and 138 at shorter physical gate lengths, the channel regions with short channel lengths will be implanted with a lesser implant dose (e.g. a $V_T$ adjust implant dose), if any, than the channel region with long channel lengths, at a given implant energy. The physical gate length at which dopant atoms are blocked from penetrating into the channel regions can be controlled by manipulating the dual polysilicon spacer thickness, the height of the silicon nitride spacers extend above the patterned polysilicon gate layer and the implant parameters (e.g. the implant energy, the implant dose and the implant angle). Therefore, depending on the implant energy, the dopant atoms may be blocked by the patterned polysilicon gate layer 114, as well as the partially overlapped internal portions of the dual polysilicon spacers 136 and 138. Processes in accordance with the present invention provide a means for independently controlling the $V_T$ Of MOS transistor devices with various physical gate lengths.

It should be understood that various alternatives to the embodiments of the invention described herein may be employed in practicing the invention. For example, while specific layer dimensions and spacing, implant doses, implant energies, and implant angles have been set forth to illustrate the invention, they are not intended to limit the invention. It is intended that the following claims define the scope of the invention and that processes within the scope of these claims and their equivalents be covered thereby.

What is claimed is:

1. A method for the formation of a physical gate length dependent implanted region in a MOS transistor device, the method comprising the steps of:

provide a semiconductor substrate with a gate oxide layer thereon;

forming a polysilicon gate layer on the gate oxide layer;

forming an additional oxide layer on the polysilicon gate layer, thereby forming an oxide/polysilicon stack;

patterning the oxide/polysilicon stack to form a patterned oxide/polysilicon stack layer that includes a patterned additional oxide layer overlying a patterned polysilicon gate layer, and to expose portions of the gate oxide layer;

forming a conformal silicon nitride layer over the patterned oxide/polysilicon stack layer and the exposed portions of the gate oxide layer;

etching the conformal silicon nitride layer to form silicon nitride spacers on the sidewalls of the patterned oxide/polysilicon stack layer;

removing the patterned additional oxide layer, thereby exposing the patterned polysilicon gate layer and leaving the silicon nitride spacers extending above the patterned polysilicon gate layer;

forming an additional polysilicon layer covering the silicon nitride spacers and the exposed patterned polysilicon gate layer;

etching the additional polysilicon layer to create dual polysilicon spacers on the sidewalls of each of the silicon nitride spacers; and implanting dopant atoms to create an implanted region in the semiconductor substrate while using the silicon nitride spacers and dual polysilicon spacers as implant masks.

2. The method of claim 1 further including the step of:

implanting LDD dopant atoms into the semiconductor substrate to form a LDD source extension region and a LDD drain extension region, after the patterning step and before the step of forming a conformal silicon nitride layer, using the patterned oxide/polysilicon stack layer as an implant mask, thereby defining a channel region in the semiconductor substrate between the LDD source extension region and the LDD drain extension region.

3. The method of claim 2 wherein the step of implanting dopant atoms includes implanting dopant atoms into the channel region.

4. The method of claim 1 wherein the step of forming an additional oxide layer includes forming an additional oxide layer selected from the group consisting of a phosposilicate glass (PSG) layer, a tetraethylorthosilicate-based (TEOS-based) oxide layer, and a silane-based oxide layer.

5. The method of claim 4 wherein the step of forming an additional oxide layer includes forming a phosphosilicate glass (PSG) layer with a thickness in the range of 1000 angstroms to 3000 angstroms.

6. The method of claim 1 wherein the patterning step includes forming a patterned oxide/polysilicon stack layer that includes patterned polysilicon gate layers of at least two different physical gate lengths.

7. The method of claim 1 wherein the step of etching the additional polysilicon layer includes etching the additional polysilicon layer to create dual polysilicon spacers that are at least partially overlapped.

8. The method of claim 1 further including the step of:

implanting source and drain dopant atoms into the semiconductor substrate, to form a source region and a drain region in the semiconductor substrate, after the step of etching the conformal silicon nitride layer and before the step of removing the patterned additional oxide layer, using the patterned oxide/polysilicon stack layer and silicon nitride spacers as implant masks.

9. The method of claim 1 wherein the step of etching the additional polysilicon layer includes anisotropically etching the additional polysilicon layer.

10. A method for the formation of a physical gate length dependent $V_T$ adjust implanted region, the method comprising the steps of:

providing a semiconductor substrate with a gate oxide layer thereon;

forming a polysilicon gate layer on the gate oxide layer;

forming an additional oxide layer on the polysilicon gate layer, thereby forming an oxide/polysilicon stack;

patterning the oxide/polysilicon stack to form a patterned oxide/polysilicon stack layer that includes a patterned additional oxide layer overlying a patterned polysilicon gate layer, and to expose portions of the gate oxide layer;

implanting LDD dopant atoms into the semiconductor substrate to form a LDD source extension region and a LDD drain extension region, after the patterning step and before the step of forming a conformal silicon nitride layer, using the patterned oxide/polysilicon stack layer as an implant mask, thereby defining a channel region in the semiconductor substrate between the LDD source extension region and the LDD drain extension region;

forming a conformal silicon nitride layer over the patterned oxide/polysilicon stack layer and the exposed portions of the gate oxide layer;

etching the conformal silicon nitride layer to form silicon nitride spacers on the sidewalls of the patterned oxide/polysilicon stack layer;

removing the patterned additional oxide layer, thereby exposing the patterned polysilicon gate layer and leaving the silicon nitride spacers extending above the patterned polysilicon gate layer;

forming an additional polysilicon layer covering the silicon nitride spacers and the exposed patterned polysilicon gate layer;

etching the additional polysilicon layer to create dual polysilicon spacers on the sidewalls of each of the silicon nitride spacers; and implanting dopant atoms, through the patterned polysilicon gate layer, into the channel region to create a $V_T$ adjust implanted region in the channel while using the silicon nitride spacers and dual polysilicon spacers as implant masks.

11. The method of claim 10 wherein the step of implanting dopant atoms includes implanting dopant atoms at an angle of zero degrees, an implant energy in the range of 10 KeV to 80 KeV and an implant dose in the range of 1E12 ions/cm$^2$ to 7E13 ions/cm$^2$.

* * * * *